(12) United States Patent
Lin et al.

(10) Patent No.: US 6,645,864 B1
(45) Date of Patent: Nov. 11, 2003

(54) PHYSICAL VAPOR DEPOSITION OF AN AMORPHOUS SILICON LINER TO ELIMINATE RESIST POISONING

(75) Inventors: Cheng Chung Lin, Taipei (TW); Lain Jong Li, Hualien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 115 days.

(21) Appl. No.: 10/068,045

(22) Filed: Feb. 5, 2002

(51) Int. Cl.[7] .............................................. H01L 21/00
(52) U.S. Cl. ...................... 438/692; 216/38; 216/88; 438/740; 438/745
(58) Field of Search ................................ 438/692, 719, 438/723, 740, 743, 745; 216/38, 88, 91

(56) References Cited

U.S. PATENT DOCUMENTS

| | | | |
|---|---|---|---|
| 5,643,407 A | 7/1997 | Chang | 156/644.1 |
| 5,932,487 A | 8/1999 | Lou et al. | 438/692 |
| 6,060,384 A | 5/2000 | Chen et al. | 438/623 |
| 6,074,941 A | 6/2000 | Hsieh et al. | 438/624 |
| 6,093,635 A | 7/2000 | Tran et al. | 438/623 |
| 6,100,179 A | 8/2000 | Tran | 438/622 |

Primary Examiner—William A. Powell
(74) Attorney, Agent, or Firm—George O. Saile; Stephen B. Ackerman; Larry J Prescott

(57) ABSTRACT

A layer of low k dielectric is formed on a substrate having a conducting electrode formed therein. A via hole is formed in the low k dielectric exposing the conducting electrode. A thin layer of amorphous silicon is deposited on the layer of low k dielectric and on the sidewalls and bottom of a via hole. A layer of resist is then formed and patterned with a trench pattern. A trench is etched in the layer of low k dielectric directly over the via hole using the patterned layer of resist. The patterned layer of resist is then stripped and the trench and via hole are filled with conducting material. The layer of amorphous silicon prevents amine radicals, $NH_x$, which can be released from the low k dielectric, especially during the via hole etching, from interacting with the resist and forming resist scum resulting in via poisoning.

28 Claims, 5 Drawing Sheets

PHYSICAL VAPOR DEPOSITION OF AN AMORPHOUS SILICON LINER TO ELIMINATE RESIST POISONING

BACKGROUND OF THE INVENTION (1) Field of the Invention

This invention relates to methods of forming a via hole within a trench in a layer of low dielectric constant dielectric which prevents via hole poisoning caused by removal of the resist mask used in etching the trench.

(2) Description of the Related Art

Resist scum can form under certain conditions and remain after a resist mask is stripped. This resist scum can form a barrier between conducting materials, such as conducting material in a via hole and a conducting electrode, causing via poisoning.

U.S. Pat. No. 5,932,487 to Lou et al. describes a method of forming a planar intermetal dielectric over conductive metal structures. A liner oxide layer is used over the conductive metal structures.

U.S. Pat. No. 5,643,407 to Chang describes the use of a nitrogen plasma treatment of a layer of spin-on-glass after via hole etching to avoid via poisoning.

U.S. Pat. No. 6,060,384 to Chen et al. describes the use of spin on HSQ, hydrogen silsesquioxane, to gap fill metal layers in high density multi-layer devices. The degradation of the HSQ layer due to photoresist stripping is overcome by treating the degraded layer with a hydrogen containing plasma.

U.S. Pat. No. 6,100,179 to Tran describes the use of a conformal dielectric liner encapsulating metal features before depositing a HSQ, hydrogen silsesquioxane, gap fill layer to form an electromigration resistant structure.

U.S. Pat. No. 6,093,635 to Tran et al. describes heat treating a HSQ, hydrogen silsesquioxane, gap fill layer in an inert atmosphere before filling via holes to thoroughly outgas water absorbed during solvent cleaning of the via hole.

U.S. Pat. No. 6,074,941 to Hsieh et al. describes a plasma treatment of a spin-on-glass layer after forming unlanded vias. The plasma comprises hydrogen and another gas.

SUMMARY OF THE INVENTION

In the fabrication of semiconductor integrated circuit devices it is often desirable to use dielectric materials having a low dielectric constant, hereinafter referred to as low k dielectric materials. Frequently trenches and via holes are formed in the low k dielectric wherein the via hole lies within the trench. The via holes are etched through the layer of low k dielectric material to expose metal contacts under the layer of low k dielectric material, using an appropriate etching method and a first resist pattern. After the via hole has been formed the first resist pattern is stripped and a trench for conducting material is formed in the layer of low k dielectric material using a second resist pattern. The trench passes directly over the via hole. An amine radical, $NH_x$, released from the low k dielectric material, especially after damage during the via etching, can interact with the second resist, used to form the trench in the layer of low k dielectric material, and form resist scum on the top of the via. This problem is known as resist poisoning of the via.

It is a principle objective of at least one embodiment of this invention to provide a method of forming a trench and via hole in a layer of low k dielectric formed on a substrate which avoids the problem of resist poisoning of the via.

It is another principle objective of at least one embodiment of this invention to provide a method of forming a trench and a via hole in a layer of low k dielectric formed on a substrate, having a layer of dielectric etch stop or metal diffusion barrier formed thereon, which avoids the problem of resist poisoning of the via.

These objectives are achieved by first forming a layer of low k dielectric, such as porous silicon dioxide, black diamond (methyl doped porous silicon dioxide), or the like on a semiconductor substrate having a conducting electrode or contact formed therein. A layer of dielectric etch stop or metal diffusion barrier can be formed on the substrate. A via hole is then formed in the layer of low k dielectric using a first resist pattern, thereby exposing part of the conducting electrode or contact. A layer of amorphous silicon is then deposited on the layer of low k dielectric using physical vapor deposition or sputtering thereby forming a layer of amorphous silicon on the top of the layer of low k dielectric, the sidewalls of the via hole, and the exposed conducting electrode or contact at the bottom of the via hole.

A layer of second resist is then formed on the substrate, filling the via hole with second resist. The layer of second resist is then patterned to form a trench pattern, thereby removing the second resist in that part of the via above a first plane and leaving the second resist in that part of the via below the first plane. The first plane is a first distance below the top surface of the layer of low k dielectric. A trench is then etched in the layer of low k dielectric. The trench extends to the level of the first plane. The resist is then stripped and a layer of barrier metal can be deposited.

A layer of conducting material, such as copper, is then deposited on the layer of barrier metal filling the trench and the via hole. That part of the layer of conducting material, that part of the layer of barrier metal, and that part of the layer of amorphous silicon above the top surface of the layer of dielectric are then removed, using a method such as chemical mechanical polishing. The thermal cycling seen by the substrate converts the amorphous silicon and the barrier metal below the first plane to metallic silicon nitride. The amorphous silicon prevents via poisoning during the developing and removal of the second resist.

DESCRIPTION OF THE PREFERRED EMBODIMENTS

Figure 1:
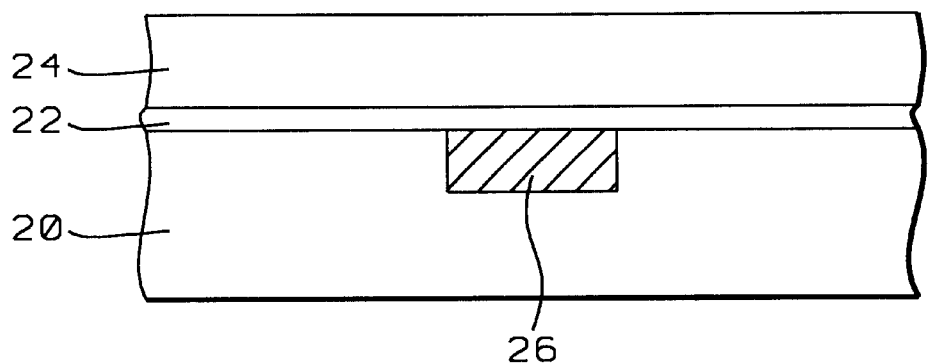
FIG. 1 shows a cross section view of a substrate having a conducting electrode or contact formed therein, a layer of dielectric etch stop or metal diffusion barrier formed thereon, and a layer of low k dielectric formed on the layer of dielectric etch stop or metal diffusion barrier.

Refer now to FIGS. 1–11 for a detailed description of the preferred embodiments of the methods of this invention. FIG. 1 shows a cross section view of a substrate 20 having a conducting electrode 26 formed therein. In this description the term conducting electrode 26 will be used to describe a conducting electrode or a conducting contact. One example of such a conducting electrode 26 is a copper damascene electrode but the invention will work equally well with other types of electrodes or contacts. The substrate can be a silicon substrate having devices formed therein, not shown. A layer of dielectric etch stop or metal diffusion barrier 22 may optionally be formed on the substrate covering the conducting electrode 26. Typically the layer of dielectric etch stop or metal diffusion barrier 22 has a thickness of between about 200 and 700 Angstroms. The metal diffusion barrier could be, but is not limited to, a material such as silicon carbide. In the case of a copper electrode the metal diffusion barrier will be a copper diffusion barrier. A layer of dielectric 24 having a low dielectric constant, low k dielectric, is then formed on the layer of dielectric etch stop or metal diffusion barrier 22. The low k dielectric typically has a dielectric constant of less than about 3.5. As an example the low k dielectric 24 can be porous silicon dioxide; black diamond, methyl doped silicon dioxide; or the like. Typically the layer of low k dielectric 24 has a thickness of between about 2000 and 10,000 Angstroms.

Figure 2:
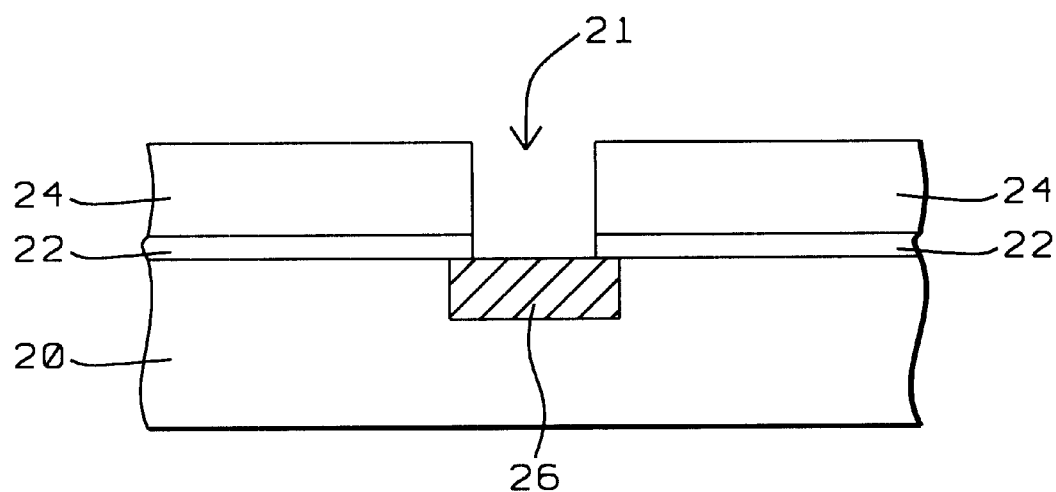
FIG. 2 shows a cross section view of the substrate of FIG. 1 after a via hole has been formed in the layer of low k dielectric and the layer of dielectric etch stop or metal diffusion barrier.

Next as shown in FIG. 2 a via hole 21 is formed in the layer of low k dielectric 24 and the layer of dielectric etch stop or metal diffusion barrier 22 thereby exposing a part of the conducting electrode 26. As will soon be described, a trench is to be formed in the layer of low k dielectric 24 to be filled with a conducting material. Part of the trench will intersect the via hole 21 so that the conducting material in the trench can make electrical contact with the conducting electrode 26. This formation of the trench will require depositing and patterning a layer of resist material. The low k dielectric material can release the amine radical, $NH_x$, especially after damage during the etching of the via hole 21. The presence of the amine radical, $NH_x$, will be especially important at the sidewalls of the via hole 21 and the top surface of the low k dielectric 24. If resist material is deposited directly over the layer of low k dielectric 24 after etching the via hole 21 the amine radical, $NH_x$, will interact with the resist and form resist scum on the top surface of the conducting electrode 26. This resist scum on the top surface of the conducting electrode 26, will cause a poor electrical connection between the metal filling the trench and the conducting electrode 26. This resist scum on the top surface of the conducting electrode is often referred to as via poisoning.

Figure 3:
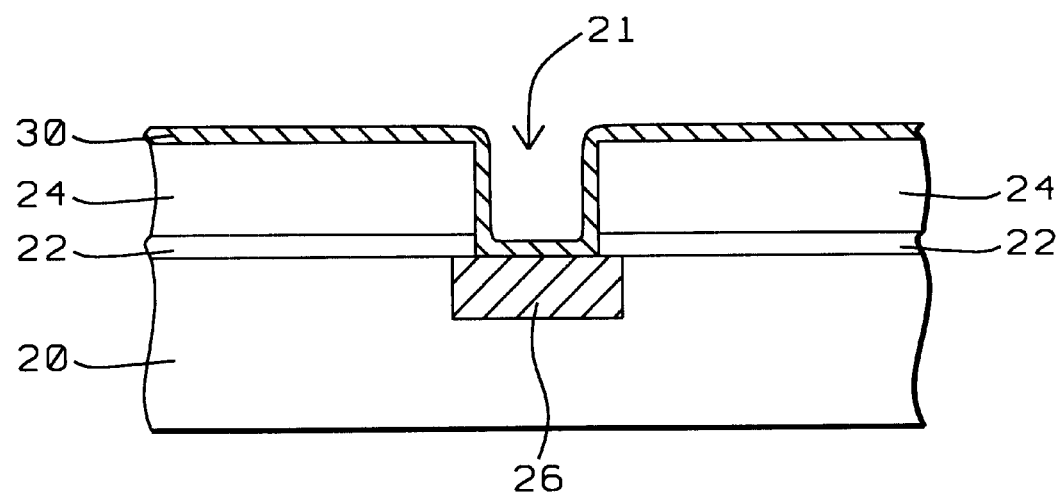
FIG. 3 shows a cross section view of the substrate of FIG. 2 after a layer of amorphous silicon has been deposited.

Next, as shown in FIG. 3, a thin layer of amorphous silicon 30 is deposited on the layer of low k dielectric 24, the sidewalls of the via hole 21, and the exposed part of the conducting electrode 26. This layer of amorphous silicon 30 is a key part of the invention as it prevents any of the amine radical, $NH_x$, from contacting any subsequently deposited resist material. The layer of amorphous silicon 30 is typically less than about 500 Angstroms thick and can be deposited using sputtering or physical vapor deposition.

Figure 4:
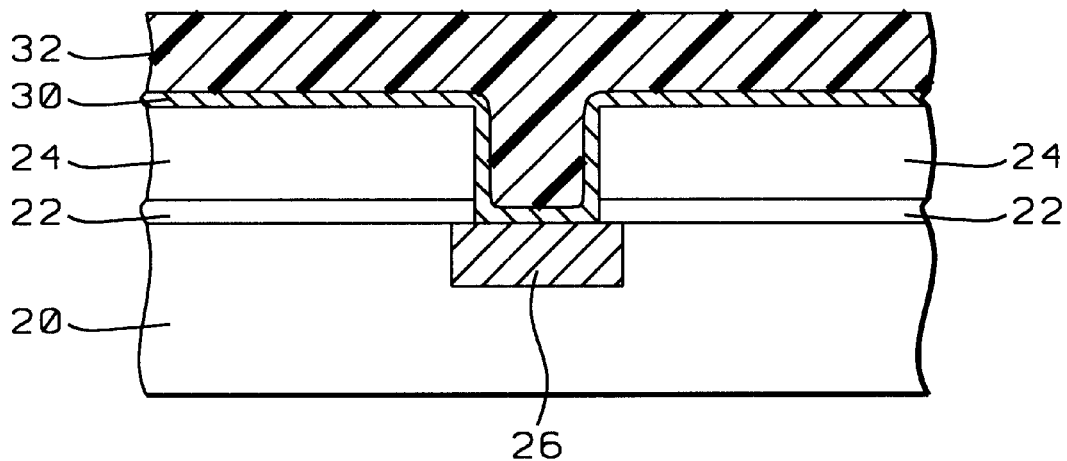
FIG. 4 shows a cross section view of the substrate of FIG. 3 after a layer of second resist has been formed on the layer of amorphous silicon.
Figure 5:
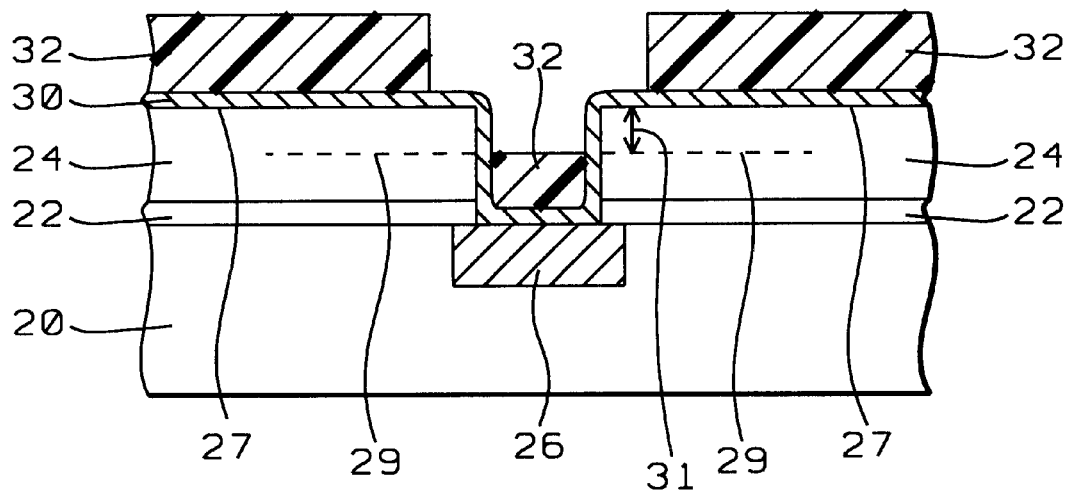
FIG. 5 shows a cross. section view of the substrate of FIG. 4 after the layer of resist has been patterned with a trench pattern.

Next, as shown in FIG. 4, a layer of resist 32 is formed on the layer of amorphous silicon 30 filling the via hole with resist 32. The layer of amorphous silicon 30 prevents any of the amine radical, $NH_x$, from contacting any part of the layer of resist 32. The resist 32 can be photoresist, electron beam resist, or the like. Next, as shown in FIG. 5 the layer of resist 32 is exposed and developed to pattern the resist thereby forming a trench pattern directly over the via hole. The patterning of the layer of resist 32 leaves resist 32 in the via hole below a first plane 29. The first plane 29 is located a first distance 31, which is the depth of the trench, below the top surface 27 of the layer of low k dielectric 24. The layer of amorphous silicon 30 protects the layer of resist 32 from the amine radical, $NH_x$, during the exposing and developing of the resist 32. Typically the first distance 31 is between about 1000 and 6000 Angstroms. Typically, as shown in FIG. 5, the width of the trench to be formed in the layer of low k dielectric 24 is greater than the diameter of the via hole. The width of the trench could also be about equal to the diameter of the trench.

Figure 6:
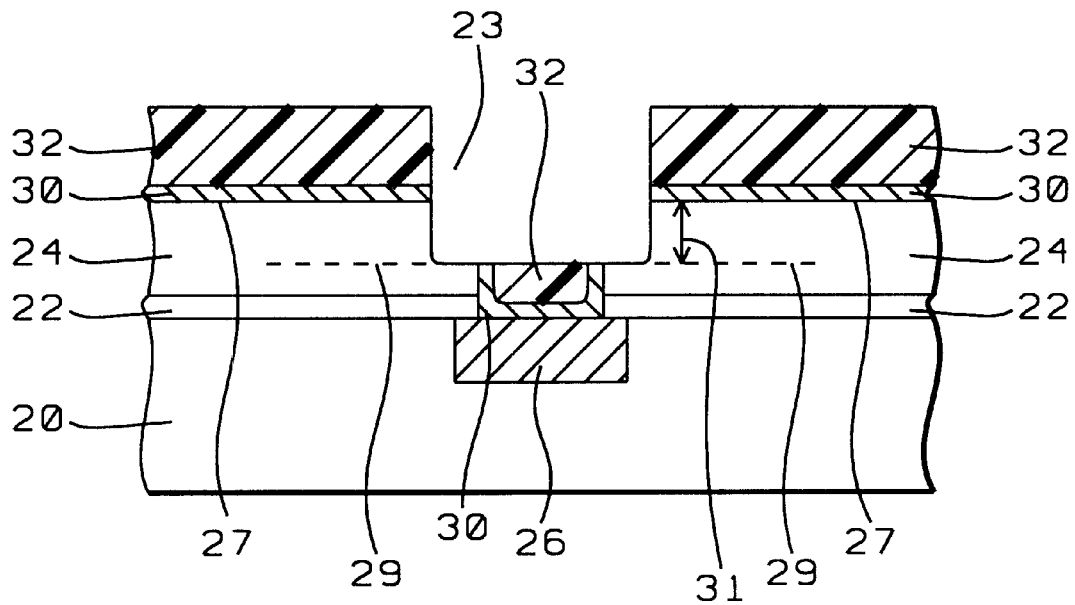
FIG. 6 shows a cross section view of the substrate of FIG. 5 after the trench has been formed.
Figure 7:
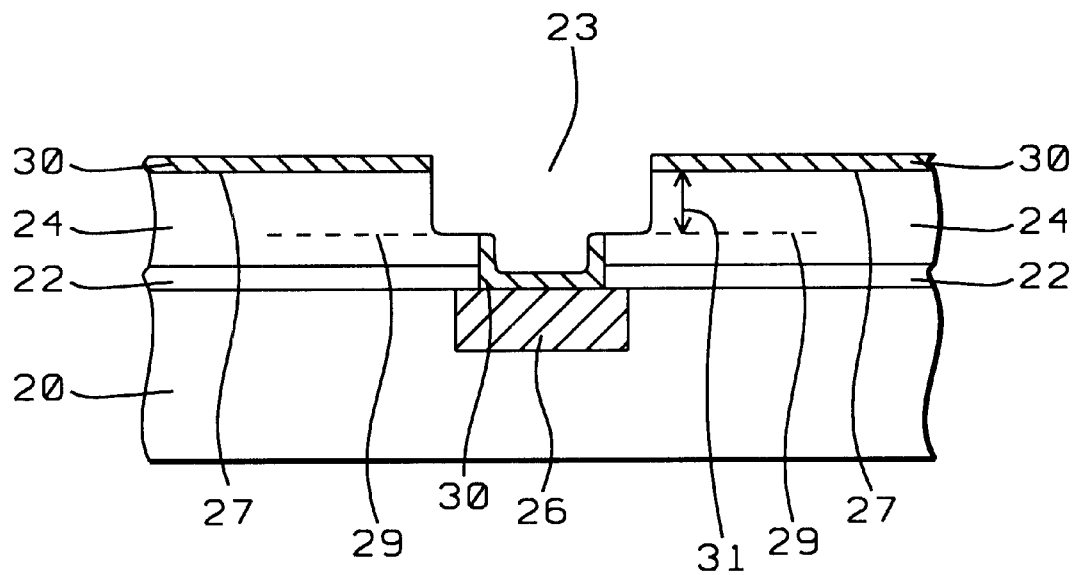
FIG. 7 shows a cross section view of the substrate of FIG. 6 after the resist has been stripped.

Next, as shown in FIG. 6, that part of the layer of amorphous silicon 30 not covered by the patterned resist 32 is etched away and a trench, having a depth equal to the first distance 31, is etched in the layer of low k dielectric 24 using the patterned layer of resist 32 as a mask. The resist material in the bottom of the via hole protects the amorphous silicon 30 on the sidewalls of the via hole and below the first plane, the amorphous silicon 30 at the bottom of the via hole, and the conducting electrode 26 at the bottom of the via hole during the etching process. Next, as shown in FIG. 7, the patterned resist is removed. Since the amorphous silicon 30 has protected the resist from amine radicals, $NH_x$, from the layer of low k dielectric 24, there is no residue or resist scum from the patterned layer of resist. Typically the patterned resist is removed using a $N_2/O_2$ plasma asher, however other methods can be used.

Figure 8:
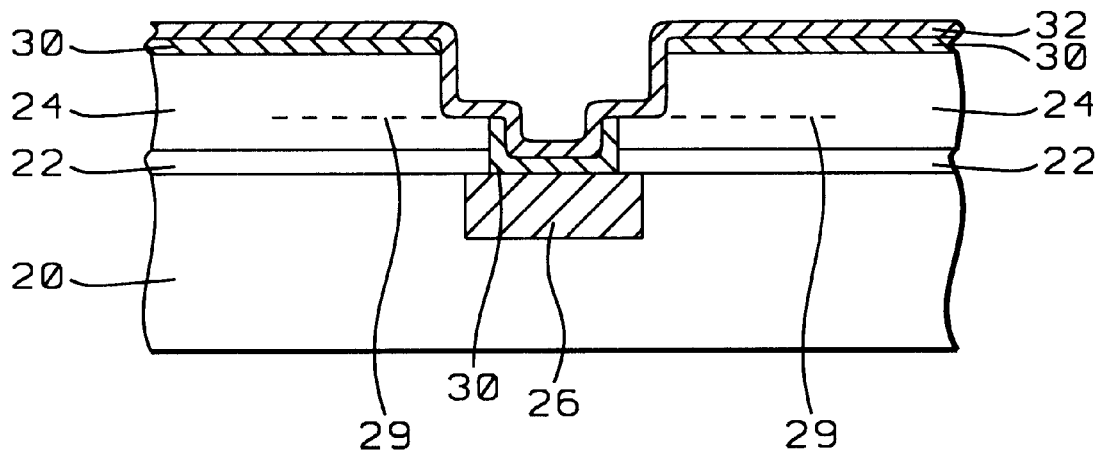
FIG. 8 shows a cross section view of the substrate of FIG. 7 after a layer of barrier metal been formed.
Figure 9:
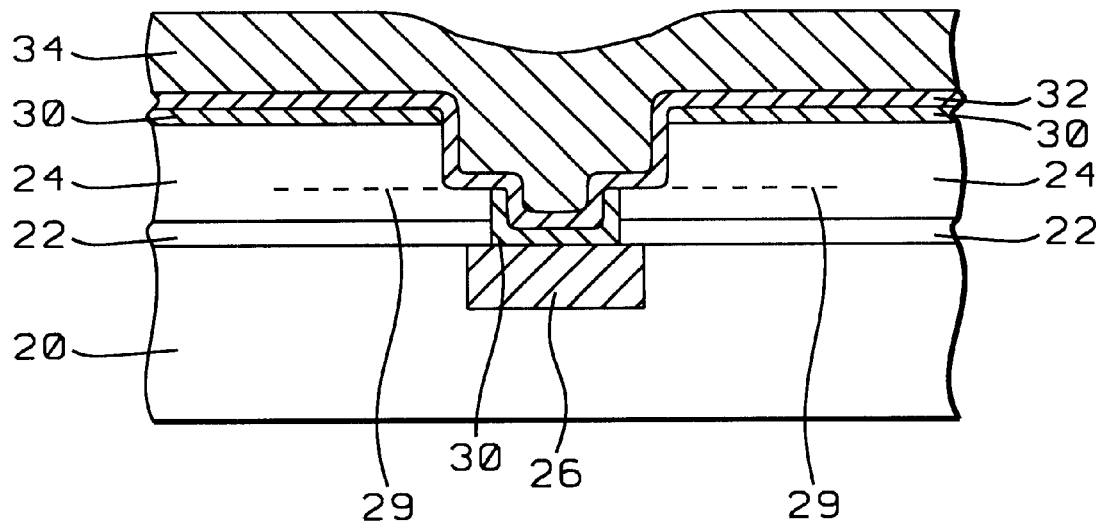
FIG. 9 shows a cross section view of the substrate of FIG. 8 after the trench and the via hole have been filled with a conducting material.
Figure 10:
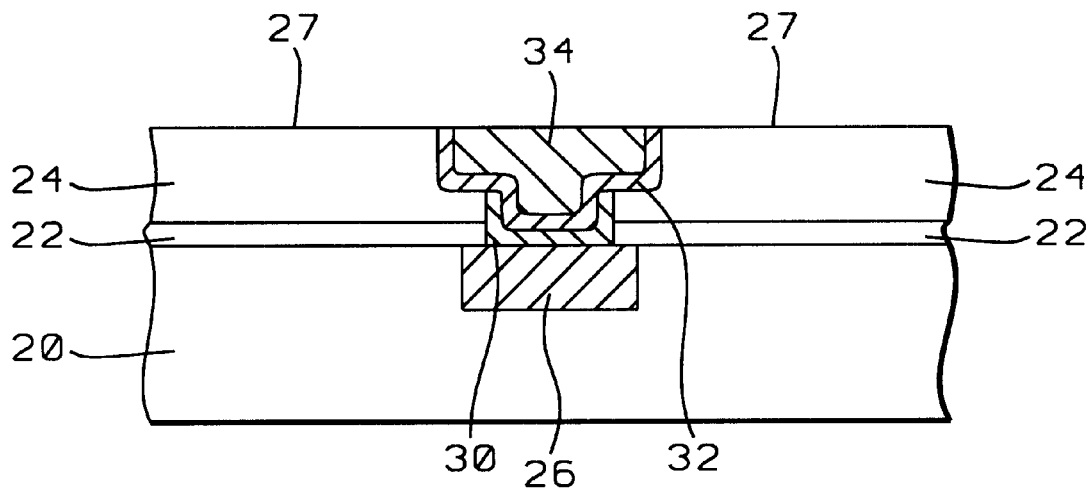
FIG. 10 shows a cross section view of the substrate of FIG. 9 after that part of the layer of conducting material, that part of the layer of barrier metal, and that part of the layer of amorphous silicon above the top surface of the layer of dielectric has been removed using chemical mechanical polishing.

Next as shown in FIG. 8 a layer of barrier metal 32, such as tantalum nitride 32, TaN, is deposited covering the remaining amorphous silicon, the sidewalls of the trench, and the amorphous silicon 30 remaining in the via hole below the first plane 29. The layer of barrier metal 32 typically has a thickness of between about 50 and 500 Angstroms. Next, as shown in FIG. 9, a layer of conducting material 34, typically copper, is deposited filling the trench in the layer of low k dielectric 24 and the via hole. As shown in FIG. 10, that part of the layer of amorphous silicon 30, that part of the layer of barrier metal 32, and that part of the layer of conducting material 34 above the top surface of the layer of low k dielectric 24 is removed, leaving the trench and via hole filled with conducting material 34. Since the layer of amorphous silicon 30 has protected the conducting electrode 26 at the bottom of the via hole, there is good electrical contact between the conducting material 34 in the trench and the via hole and the conducting electrode 26. The amorphous silicon 30, barrier metal 32, and conducting material 34 above the top surface of the layer of low k dielectric 24 is typically removed using chemical mechanical polishing.

Figure 11:
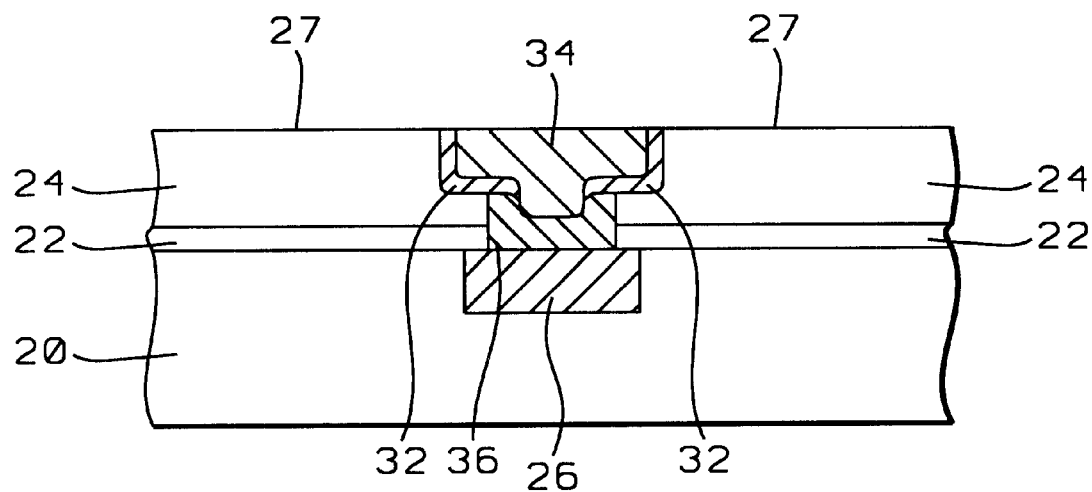
FIG. 11 shows a cross section view of the substrate of FIG. 10 after the amorphous silicon and barrier metal below the first plane have been converted to metallic silicon nitride.

As shown in FIG. 11, during process thermal cycling the barrier metal and amorphous silicon below the first plane 29 will interdiffuse forming metal silicon nitride 36. The metal silicon nitride 36 will form an improved barrier for preventing diffusion of the conducting electrode 26 material into the low k dielectric 24, especially for the case when the conducting electrode 26 is copper. In the example where the barrier metal is tantalum nitride, this interdiffusion forms tantalum silicon nitride.

While the invention has been particularly shown and described with reference to the preferred embodiments thereof, it will be understood by those skilled in the art that various changes in form and details may be made without departing from the spirit and scope of the invention.

What is claimed is:

1. A method of forming a trench and via hole, comprising:
    providing a substrate;
    forming a conducting electrode in said substrate;
    forming a layer of dielectric on said substrate wherein said layer of dielectric has a top surface and a first plane, and wherein said first plane is a first distance below said top surface of said layer of dielectric;
    etching a via hole having sidewalls in said layer of dielectric thereby exposing part of said conducting electrode;
    depositing a layer of amorphous silicon on said layer of dielectric, said sidewalls of said via hole, and said exposed part of said conducting electrode;
    forming a layer of resist on said layer of amorphous silicon thereby filling said via hole with resist;
    patterning said layer of resist thereby forming a trench pattern in said layer of resist;
    etching a trench in said layer of dielectric above said first plane using said patterned layer of resist as a mask;
    removing said patterned layer of resist; and
    filling said trench and said via hole with conducting material.

2. The method of claim 1 wherein said layer of dielectric is a layer of dielectric material having a dielectric constant of less than about 3.5.

3. The method of claim 1 wherein said layer of dielectric is black diamond, methyl doped porous silicon dioxide.

4. The method of claim 1 wherein said layer of dielectric is porous silicon dioxide.

5. The method of claim 1 wherein said conducting electrode is a copper electrode.

6. The method of claim 1 further comprising forming a layer of barrier metal on that part of said layer of amorphous silicon below said first plane.

7. The method of claim 6 wherein said layer of barrier metal has a thickness of less than about 500 Angstroms.

8. The method of claim 6 wherein said layer of barrier metal is a layer of titanium nitride.

9. The method of claim 6 further comprising thermal cycling said substrate after forming said layer of barrier metal wherein that part of said amorphous silicon and that part of said barrier metal below said first plane forms metal silicon nitride.

10. The method of claim 1 wherein said conducting material is copper.

11. The method of claim 1 wherein said amorphous silicon is deposited using physical vapor deposition.

12. The method of claim 1 wherein said amorphous silicon is deposited using sputtering.

13. The method of claim 1 wherein said layer of amorphous silicon has a thickness of less than about 500 Angstroms.

14. The method of claim 1 wherein said substrate is a silicon substrate having devices formed therein.

15. A method of forming a trench and via hole, comprising:
    providing a substrate;
    forming a conducting electrode in said substrate;
    forming a layer of dielectric etch stop or metal diffusion barrier on said substrate wherein said layer of dielectric etch stop or metal diffusion barrier covers said conducting electrode;
    forming a layer of dielectric on said layer of dielectric etch stop or metal diffusion barrier wherein said layer of dielectric has a top surface and a first plane, wherein said first plane is a first distance below said top surface of said layer of dielectric;
    etching a via hole having sidewalls in said in said layer of dielectric and said layer of dielectric etch stop or said metal diffusion barrier thereby exposing a part of said conducting electrode;
    depositing a layer of amorphous silicon on said layer of dielectric, said sidewalls of said via hole, and said exposed part of said conducting electrode;
    forming a layer of resist on said layer of amorphous silicon thereby filling said via hole with resist;
    patterning said layer of resist thereby forming a trench pattern in said layer of resist and leaving resist in that part of said via hole below said first plane, wherein said via hole lies within said trench pattern;
    etching a trench in that part of said layer of dielectric above said first plane using said patterned layer of resist as a mask by etching away that part of said amorphous silicon and that part of said dielectric not covered by said trench pattern and above said first plane;
    removing said patterned layer of resist and said resist in said via hole below said first plane;
    depositing a layer of barrier metal on said layer of dielectric, said sidewalls of said trench, and that part of said layer of amorphous silicon below said first plane, after removing said patterned layer of resist;
    depositing a layer of conducting material on said layer of barrier metal thereby filling said trench and said via hole with conducting material; and
    removing that part of said layer of conducting material, that part of said layer of barrier metal, and that part of said layer of amorphous silicon above said top surface of said layer of dielectric.

16. The method of claim 15 wherein said layer of dielectric is a layer of dielectric having a dielectric constant below about 3.5.

17. The method of claim 15 wherein said layer of dielectric is black diamond, methyl doped porous silicon dioxide.

18. The method of claim 15 wherein said layer of dielectric is porous silicon dioxide.

19. The method of claim 15 wherein said conducting electrode is a copper electrode.

20. The method of claim 15 wherein said conducting material is copper.

21. The method of claim 15 wherein said removing that part of said layer of conducting material, that part of said layer of barrier metal, and that part of said layer of amorphous silicon above said top surface of said layer of dielectric is accomplished using chemical mechanical polishing.

22. The method of claim 15 wherein said barrier metal is tantalum nitride.

23. The method of claim 15 further comprising thermal cycling said substrate after forming said layer of barrier metal wherein that part of said amorphous silicon and that part of said barrier metal below said first plane forms metal silicon nitride.

24. The method of claim 15 wherein said amorphous silicon is deposited using physical vapor deposition.

25. The method of claim 15 wherein said amorphous silicon is deposited using sputtering.

26. The method of claim 15 wherein said layer of amorphous silicon has a thickness of less than 500 Angstroms.

27. The method of claim 15 wherein said layer of barrier metal has a thickness of less than 500 Angstroms.

28. The method of claim 15 wherein said substrate is a silicon substrate having devices formed therein.

* * * * *